US012724172B2

(12) United States Patent
Farhadi Nia

(10) Patent No.: US 12,724,172 B2
(45) **Date of Patent: *Sep. 1, 2026**

(54) DYNAMIC ENGINE FOR A COGNITIVE RESERVOIR SYSTEM

(71) Applicant: BEYOND LIMITS, INC., Glendale, CA (US)

(72) Inventor: Shahram Farhadi Nia, Glendale, CA (US)

(73) Assignee: Beyond Limits, Inc., Glendale, CA (US)

( * ) Notice: Subject to any disclaimer, the term of this patent is extended or adjusted under 35 U.S.C. 154(b) by 708 days.

This patent is subject to a terminal disclaimer.

(21) Appl. No.: 18/106,187

(22) Filed: Feb. 6, 2023

(65) Prior Publication Data

US 2023/0184993 A1 Jun. 15, 2023

Related U.S. Application Data

(63) Continuation of application No. 16/157,757, filed on Oct. 11, 2018, now Pat. No. 11,579,332.

(Continued)

(51) Int. Cl.

*G06F 30/20* (2020.01)
*G01V 20/00* (2024.01)

(Continued)

(52) U.S. Cl.

CPC .............. *G01V 20/00* (2024.01); *G06F 30/20* (2020.01); *G06N 3/043* (2023.01); *G06N 3/088* (2013.01)

(58) Field of Classification Search

CPC ........ G06F 30/20; G01V 99/005; G06N 3/04; G06N 3/0436; G06N 3/0454; G06N 3/08; G06N 3/088; G06N 3/043; G06N 3/045

(Continued)

(56) References Cited

U.S. PATENT DOCUMENTS 5,371,832 A 12/1994 Eichfeld et al.
6,295,504 B1 9/2001 Ye et al.

(Continued)

FOREIGN PATENT DOCUMENTS

WO WO 2016/140645 9/2016
WO WO 2017/079178 5/2017

(Continued)

OTHER PUBLICATIONS

U.S. Appl. No. 17/880,298, Office Action dated Dec. 6, 2023.

(Continued)

*Primary Examiner* — Andre Pierre Louis
(74) *Attorney, Agent, or Firm* — Polsinelli LLP

(57) ABSTRACT

Implementations described and claimed herein provide systems and methods for developing a reservoir. In one implementation, a static model of the reservoir is received. The static model has one or more clusters of rock types. A reservoir graph is generated from the static model. The reservoir graph represents each of the one or more clusters as a vertex. A graph connectivity of the reservoir graph is defined through a nodal connectivity of neighboring vertices. Pressure values are propagated across three-dimensional space of the reservoir graph using the connectivity. A dynamic model of the reservoir is generated using the pressure values and fluid saturation values.

21 Claims, 8 Drawing Sheets

Related U.S. Application Data

(60) Provisional application No. 62/571,150, filed on Oct. 11, 2017.

(51) Int. Cl.
*G06N 3/043* (2023.01)
*G06N 3/088* (2023.01)

(58) Field of Classification Search
USPC .......................................................... 703/9, 10
See application file for complete search history.

(56) References Cited

U.S. PATENT DOCUMENTS

| | | | |
|---|---|---|---|
| 6,424,958 | B1 | 7/2002 | Pappalardo et al. |
| 11,143,789 | B2 | 10/2021 | Golmohammadizangabad |
| 11,422,284 | B2 | 8/2022 | Nia |
| 11,454,738 | B2 | 9/2022 | Nolan |
| 11,579,332 | B2 | 2/2023 | Nia |
| 11,852,778 | B2 | 12/2023 | Golmohammadizangabad et al. |
| 12,055,673 | B2 | 8/2024 | Nia et al. |
| 2004/0133531 | A1* | 7/2004 | Chen ........................ G06N 3/09 706/46 |
| 2005/0039036 | A1 | 2/2005 | Eisen |
| 2006/0285436 | A1 | 12/2006 | Mayorga et al. |
| 2009/0020284 | A1 | 1/2009 | Graf et al. |
| 2009/0119018 | A1 | 5/2009 | Priezzhev et al. |
| 2009/0204377 | A1 | 8/2009 | Van Wagoner et al. |
| 2010/0235154 | A1 | 9/2010 | Meurer et al. |
| 2011/0002194 | A1* | 1/2011 | Imhof ...................... G01V 1/32 367/53 |
| 2012/0203525 | A1 | 8/2012 | Herrera et al. |
| 2012/0221306 | A1 | 8/2012 | Hurley et al. |
| 2013/0124171 | A1 | 5/2013 | Schuette et al. |
| 2015/0066460 | A1 | 3/2015 | Klinger et al. |
| 2015/0300151 | A1 | 10/2015 | Mohaghegh |
| 2015/0301224 | A1* | 10/2015 | Ramsay .................. E21B 43/00 702/6 |
| 2015/0347898 | A1 | 12/2015 | Hiu et al. |
| 2016/0078345 | A1 | 3/2016 | Rajati et al. |
| 2016/0259088 | A1 | 9/2016 | Carvajai et al. |
| 2017/0336811 | A1 | 11/2017 | Stone et al. |
| 2018/0181693 | A1 | 6/2018 | Yang |
| 2018/0188403 | A1 | 7/2018 | Halsey et al. |
| 2018/0321421 | A1 | 11/2018 | Halabe et al. |
| 2019/0107642 | A1 | 4/2019 | Nia |
| 2019/0107643 | A1 | 4/2019 | Golmohammadizangabad |
| 2019/0107644 | A1 | 4/2019 | Nia |
| 2019/0107645 | A1 | 4/2019 | Nolan |
| 2019/0219734 | A1 | 7/2019 | Solans et al. |
| 2022/0026598 | A1 | 1/2022 | Golmohammadizangabad |
| 2022/0381948 | A1 | 12/2022 | Nia |
| 2022/0413182 | A1 | 12/2022 | Nolan |
| 2024/0036231 | A1 | 2/2024 | Golmohammadizangabad et al. |

FOREIGN PATENT DOCUMENTS

| | | |
|---|---|---|
| WO | WO 2019/075242 | 4/2019 |
| WO | WO 2019/075245 | 4/2019 |
| WO | WO 2019/075247 | 4/2019 |
| WO | WO 2019/075250 | 4/2019 |

OTHER PUBLICATIONS

U.S. Appl. No. 17/901,629, Final Office Action mailed Apr. 11, 2024.

Darabi et al., 3D fracture modeling in Parsi oil field using artificial intelligence tools, 2010, pp. 67-76.

Quahed et al., Application of artificial intelligence to characterize naturally fractured zones in Hassi Messaoud Oil Field, Algeria, May 2005, pp. 122-141.

Application No. PCT/US2018/055471 International Preliminary Report on Patentability dated Apr. 14, 2020.

Application No. PCT/US2018/055471 International Search Report and Written Opinion dated Jan. 7, 2019.

Application No. PCT/US2018/055475 International Preliminary Report on Patentability dated Apr. 14, 2020.

Application No. PCT/US2018/055475 International Search Report and Written Opinion dated Feb. 5, 2019.

Application No. PCT/US2018/055477 International Preliminary Report on Patentability dated Apr. 14, 2020.

Application No. PCT/US2018/055477 International Search Report and Written Opinion dated Jan. 7, 2019.

Application No. PCT/US2018/055480 International Preliminary Report on Patentability dated Apr. 14, 2020.

Application No. PCT/US2018/055480 International Search Report and Written Opinion dated Dec. 31, 2018.

U.S. Appl. No. 16/157,716 Office Action mailed Jul. 14, 2021.

U.S. Appl. No. 16/157,732 Office Action mailed Jan. 4, 2021.

U.S. Appl. No. 17/497,477 Office Action mailed Mar. 13, 2023.

U.S. Appl. No. 16/157,757 Office Action mailed Jan. 19, 2022.

U.S. Appl. No. 16/157,764 Office Action mailed Aug. 25, 2021.

Amindoust et al. (Sustainable supplier selection: A ranking model based on fuzzy interference system, 2012, pp. 1668-1677) (Year: 2012).

U.S. Appl. No. 17/901,629 Office Action mailed Oct. 5, 2023.

* cited by examiner

DYNAMIC ENGINE FOR A COGNITIVE RESERVOIR SYSTEM

CROSS-REFERENCE TO RELATED APPLICATIONS

The present application is a continuation and claims priority benefit to U.S. patent application Ser. No. 16/157,757 filed Oct. 11, 2018, now U.S. Pat. No. 11,579,332, which claims priority benefit to U.S provisional patent application 62/571,150, filed Oct. 11, 2017, which are specifically incorporated by reference in their entirety herein.

TECHNICAL FIELD

Aspects of the present disclosure relate to exploration, evaluation, development, and production of a reservoir, and more particularly to systems and methods for dynamic modeling of the reservoir through a graph representation.

BACKGROUND

A reservoir is subsurface pool of a natural resource, such as oil and/or gas, contained within rock formations, which have varying levels of porosity and permeability. The porosity is dictated by the pore volume of the rock, while the permeability relates to the ability of the rock to allow the natural resource to flow through for collection. Reservoirs are identified using hydrocarbon exploration techniques, such as seismic data acquisition, and involve drilling exploratory wells with well log measurements along the well trajectories. Well logs are a concise, indirect, and detailed plot of formation parameters versus depth that are captured using logging tools ran along the well trajectory. Using the well logs, petrophycisits may identify lithologies, differentiate between porous and nonporous rock, and identify payzones in the subsurface rock formations where the natural resource exists in exploitable quantities.

However, while characteristics of the petrophysical phenomena, including porosity and permeability, along the well trajectory may be known, uncertainty of the petrophysics of the subformation increases as distance from the well increases. Accordingly, reservoir modeling is utilized to estimate the volumetric properties of the rock for use in decision making regarding field development, future production prediction, well placement, and other reservoir development activities. Conventionally, a suite of professionals are involved in gathering the data, generating the model, simulating it through time and employing the model in decision making. Each of these professionals is typically utilizing a discrete tool that outputs results dictated by underlying assumptions by the professional and handing off the results to another professional to be used in the next step. As such, the end to end process is conventionally plagued with human error and bias in the results generated by each tool with no retention of the disparate professional opinions that were presented during the discrete processes but rejected. In addition to human error and bias influencing the results, conventional systems and methods have inconsistent workflows and inefficient handoffs and fail to integrate the discrete tools with disparate programming languages and to retain alternative opinions, assumptions, and underlying data. Overall, conventional systems and methods fail to meaningfully reduce uncertainty and risk in reservoir exploration, evaluation, development, and production. It is with these observations in mind, among others, that various aspects of the present disclosure were conceived and developed.

SUMMARY

Implementations described and claimed herein address the foregoing problems by providing systems and methods for developing a reservoir. In one implementation, a static model of the reservoir is received. The static model has one or more clusters of rock types. A reservoir graph is generated from the static model. The reservoir graph represents each of the one or more clusters as a vertex. A graph connectivity of the reservoir graph is defined through a nodal connectivity of neighboring vertices. Pressure values are propagated across three-dimensional space of the reservoir graph using the connectivity. A dynamic model of the reservoir is generated using the pressure values and fluid saturation values.

Other implementations are also described and recited herein. Further, while multiple implementations are disclosed, still other implementations of the presently disclosed technology will become apparent to those skilled in the art from the following detailed description, which shows and describes illustrative implementations of the presently disclosed technology. As will be realized, the presently disclosed technology is capable of modifications in various aspects, all without departing from the spirit and scope of the presently disclosed technology. Accordingly, the drawings and detailed description are to be regarded as illustrative in nature and not limiting.

DETAILED DESCRIPTION

Aspects of the present disclosure involve systems and methods for the characterization and exploitation of a reservoir using artificial intelligence techniques. Generally, a reservoir development system is an end to end automated system permitting local expertise to be injected into a series of modular processes with a handoff between the modular processes conducted through a common integration platform. The reservoir development system thus provides an integration platform for numerous data-driven, physics-based, expertise and policy elements to determine where to drill in the reservoir with a justification for which the underlying reasoning may be traced. To arrive at the decision of where to drill, the reservoir development system generates a static model comprising a probabilistic geological representation of the reservoir. The reservoir development system quantifies uncertainty in the static model and considers risk in the reasoning. From the static model, the reservoir development system generates a dynamic model of the reservoir, which analyzes the aspects of the reservoir that change over time through a graph representation. Given the dynamic model, the system uses graph traversal algorithms to find a travel-time between different nodes of the graph. The reservoir development system provides a ranking of target volumes for drilling with supporting information in relative and absolute terms detailing how the ranking was produced. If any of the underlying information changes, the reservoir development system may provide real time reranking. Overall, the reservoir development system reduces human bias and error, provides a consistent workflow, facilitates handoffs, retains alternative opinions and supporting information, addresses uncertainty, and accommodates changes to the supporting information. These benefits, among others, will be apparent from the present disclosure.

Figure 1:
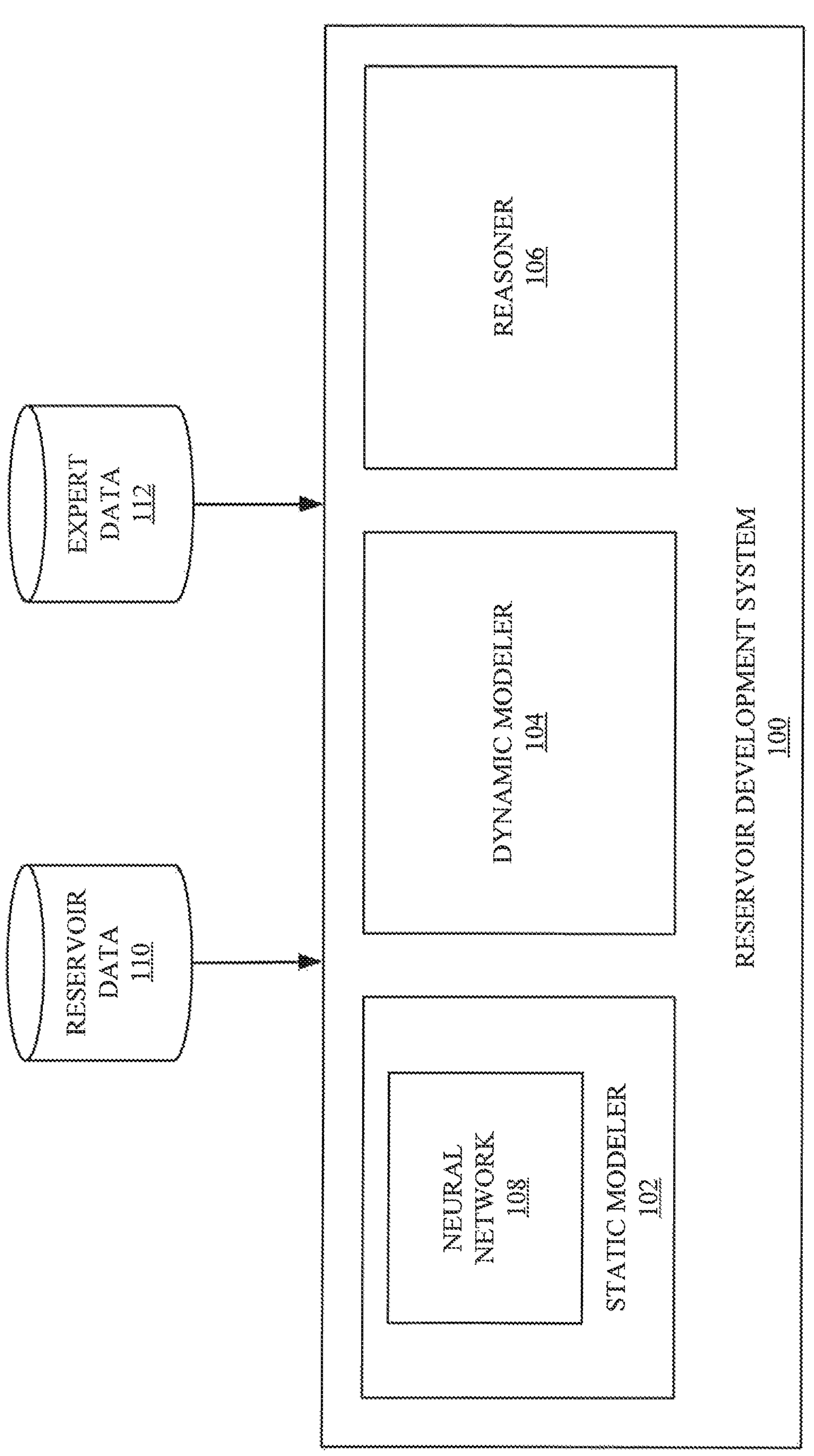
FIG. 1 illustrates an example reservoir development system including a static modeler, a dynamic modeler, and a reasoner.

To begin a detailed description of an example reservoir development system 100, reference is made to FIG. 1. In one implementation, the reservoir development system 100 incorporates data into an integrated model of a probable, true state of a reservoir and provides an assessment of one or more target regions of the reservoir having a high probability of production. The reservoir development system 100 expedites multi-disciplinary collaboration in an integrated platform. More particularly, the reservoir development system 100 integrates multi-physics data, diverse-expertise input and policies. Using various machine learning techniques, the reservoir development system 100 quantifies uncertainty and provides an automatic configuration and reconfiguration of plumbing of the reservoir. The reservoir development system 100 generates a model of the reservoir and reduces the model and underlying data to symptoms for one or more target regions of the reservoir. A ranking of these target regions is output by the reservoir development system 100 to a user device for interaction by a user via a user interface. An explanation of the rankings and decisions made during the process forming the basis of the rankings may be provided via the user interface. Overall, the reservoir development system 100 provides an expedited testing and analysis of hypotheses to identify target regions.

In one implementation, the reservoir development system 100 includes a static modeler 102, a dynamic modeler 104, and a reasoner 106. The static modeler 102 generates a static model of the reservoir using a neural network 108 while quantifying uncertainty, and the dynamic modeler 104 generates a dynamic model of the reservoir using the static model. In one implementation, a plurality of dynamic models is generated to preserve the uncertainty represented in the static data. The reservoir development system 100 determines a validation of the dynamic models. Based on the dynamic model(s), the reasoner 106 generates a ranking of target regions for drilling with supporting information in relative and absolute terms detailing how the ranking was produced. In one implementation, macro-variables, such as connected oil volume, are produced from a graph representation of the reservoir by the dynamic modeler 104, and the macro-variables are received by the reasoner 106, which ranks the macro-variables against a set of rules.

The reservoir development system 100 receives and digests data from one or more sources. In one implementation, the data includes reservoir data 110 captured using one or more measuring tools deployed at a reservoir and expert data 112 including reservoir data having one or more attributes expertly labeled by a professional. Any changes to the expert labels of the same attribute may be retained and stored in a database for subsequent access and analysis.

In one implementation, the reservoir data 110 includes, without limitation, field data and well data. The field data may include four-dimensional (4D) seismic data, which incorporates a plurality of time-lapsed three-dimensional (3D) subsurface images portraying changes in the reservoir over time. The well data includes various information captured about one or more wells at the reservoir and may include, without limitation, well name, well trajectories, well logs, completions, production, pressure, and/or the like. Each of the well trajectories is a path along which a well is drilled at the reservoir. Well logs are a concise, indirect, and detailed plot of formation parameters versus depth that are captured using logging tools ran along the well trajectory. The well logs may include gamma ray (GR), neutron porosity (NPss), bulk density (RhoB), shallow, medium, and deep resistivities (RDeep, Rmedium, Rshallow), and/or the like. The completions may include perforation intervals, and the production may include oil production, gas production, and/or water production. The pressure may include buildup test results.

The expert data 112 may include, without limitation, expertly labeled seismic data, expertly labeled well logs, OWCS, and/or the like. The expertly labeled seismic data may include fault data and/or surface data, and the expertly labeled well logs may include permeability, porosity, and/or the like. The expert data 112 may include the same data labeled by a plurality of experts with commonalities and differences of attributes labeled by the experts tracked and stored.

In one implementation, the static modeler 102 receives static data of the reservoir data 110 and the expert data 112, and utilizing a chain of supervised and unsupervised machine learning algorithms, the static modeler 102 realizes a static characterization of the reservoir while quantifying uncertainty. More particularly, the static modeler 102 receives well logs and well trajectory data, including a set of observed data points (with x, y, and z coordinates for each measurement) in a volume along a well trajectory. Using the well logs and the well trajectory data, the neural network 108 of the static modeler 102 generates 3D populated logs across a volume of the reservoir.

Uncertainty increases with distance away from the well trajectory where volumetric density of information is lower. As such, the static modeler 102 quantifies uncertainty using the neural network 108. In one implementation, the static modeler 102 generates n random points in 3D space. For each of the observed data points in the well trajectory data, the static modeler 102 generates a set of feature vectors based on a distance between the observed data point and each of the random points. Each feature vector includes corresponding log values from the well logs. The neural network 108 is trained with the feature vectors and propagates the values across the volume of the reservoir to generate a 3D populated log. The source of the uncertainty is the n random points. To address this uncertainty, the static modeler 102 changes the random points, which changes the training data for the neural network 108 and thus the 3D populated log generated by the neural network 108. As such, the neural network 108 generates a plurality of 3D populated log realizations that are each different and equally probable.

In one implementation, the static modeler 102 generates log attributes, including permeability, porosity, initial water saturation, and/or the like, populated across the 3D representation for each realization. Petrophysicist assigned rock properties, including porosity and permeability, may be used to train a transformation function from log attributes to permeability, porosity, initial water saturation, and/or the like. The log attributes are generated using a k-nearest neighbors algorithm, using an average of the different 3D populated log realizations. The k-nearest neighbors algorithm is thus performed over many instances for each of NPSS, RhoB, GR, and RDEEP.

From the static log values, the static modeler 102 generates a static model of the reservoir by clustering the reservoir into one or more rock types. In one implementation, the static model is generated through k-means clustering, which partitions n observations into k clusters in which each observation belongs to the cluster with the nearest mean. The clusters of the static model obtained through the k-means clustering includes NPSS, RhoB, GR, and RDEEP values at each voxel of the 3D representation.

In one implementation, the static modeler 102 receives seismic data, which may be expertly labeled and include surfaces of one or more layers of the reservoir and fault data, including fault polygons. From the seismic data, the static modeler 102 generates fault planes through 3D plane fitting to add faults to the clusters of the static model. The static modeler is thus a static characterization of the reservoir that quantifies uncertainty.

Figure 2:
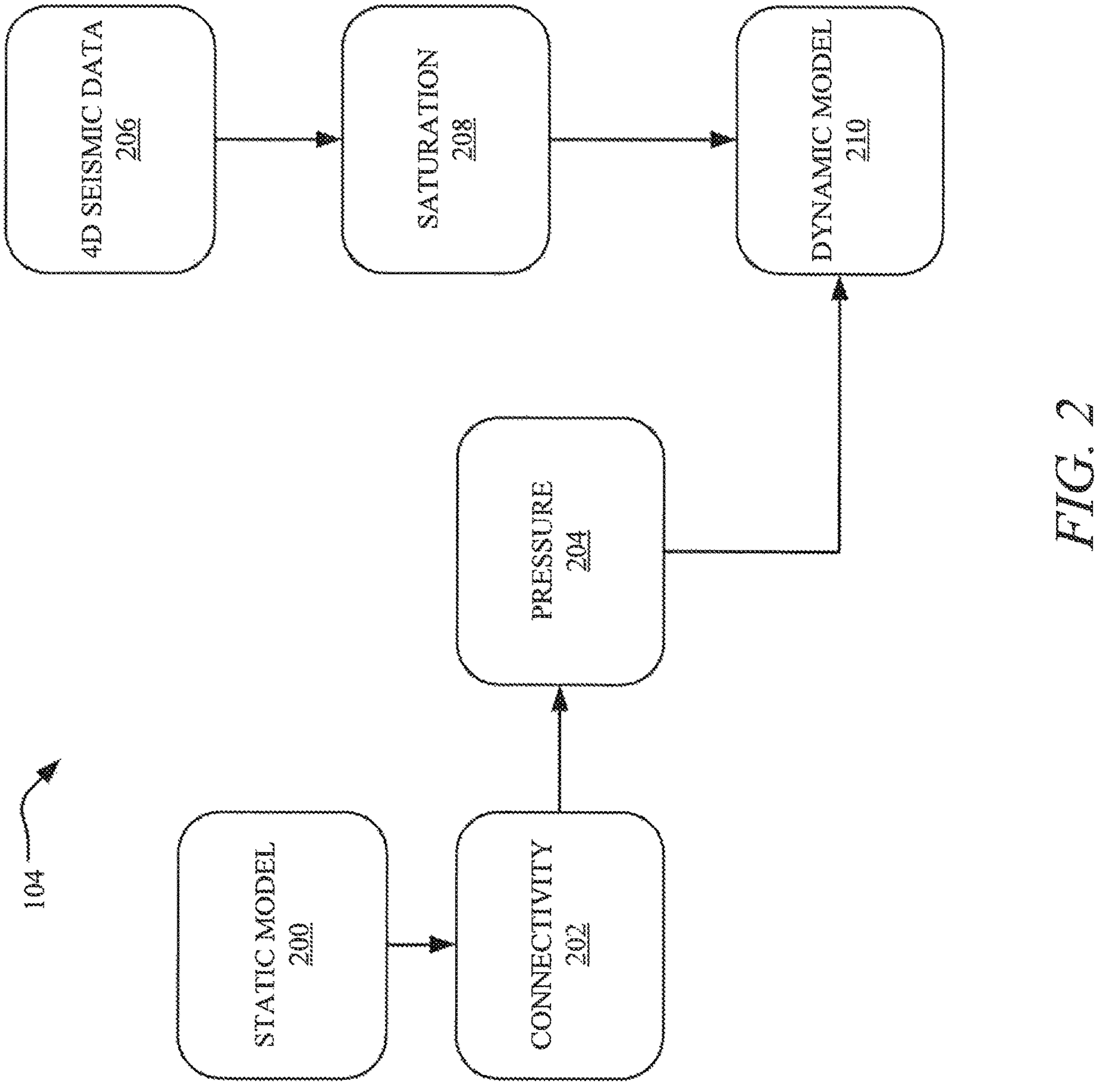
FIG. 2 illustrates an example dynamic modeler of the reservoir development system.

As can be understood from FIGS. 1-2, the dynamic modeler 104 receives a static model 200 from the static modeler 102 and time dependent data for the reservoir. Generally, the dynamic modeler 104 utilizes semi-supervised artificial intelligence to build higher order connectivity relationships among static regions according to diffusivity equations governing physics of flow in porous media. Stated differently, the dynamic modeler 104 represents the static model 200 as a graph and enables integration of different data-derived attributes as well as fundamental physics of flow in porous media. In one implementation, the dynamic modeler 104 has a learning capability to modify the underlying static model(s) 200.

In one implementation, the dynamic modeler 104 receives clusters of rock types from the static model 200 and constructs a reservoir graph representing the clusters as graph vertices. The vertex properties of graph representation of the static model 200 includes location (x, y, z), porosity, pore volume, permeability, and initial oil saturation. Each vertex is defined to contain a spatially continuous voxel set. The dynamic model 104 defines graph connectivity 202 through nodal connectivity of neighboring clusters. The graph may be updated automatically with new fault planes, which act as nodes with zero or reduced permeability. The faults change the connectivity 202 across the domain. Low confidence faults that are identified a number of times below a threshold may be removed. The dynamic modeler 104 transforms the static model 200 into nodes including fault effects and defines the connectivity 202.

In one implementation, the dynamic modeler 104 estimates pressure 204 using the connectivity 202. The nodes with high connectivity are more likely to have similar pressures. Continuity in reservoir fluids allows for propagating pressure from observation points across the 3D network. The areas with no connectivity to the observation points are considered uncertain in pressure values. As such, when a new pressure point becomes available, the dynamic modeler 104 propagates the new pressure point across the volume. The dynamic modeler 104 utilizes the connectivity 202 in the 3D structure to propagate pressure observations 204. The dynamic modeler 104 receives 4D seismic data 206 from which the dynamic modeler 104 determines fluid saturation 208 across the reservoir. From the graph construction of the static model 200, the pressure 204, and the fluid saturation 208, the dynamic modeler 104 generates a dynamic model 210 of the reservoir. Stated differently, the dynamic modeler 104 learns over the graph construction using production and pressure data.

The dynamic model 210 may be augmented with additional data sources and updated over time, for example, as the pressure and/or the saturation changes. Further, modular properties may be ascribed to the dynamic model 210 for interpretation by the reasoner 106. The static modeler 102 and the dynamic modeler 104 reduce integration time between static and dynamic data, facilitate assimilation of pressure and saturation observations, and expedite construction of 3D plumbing of the reservoir. The reasoner 106 utilizes the reservoir model, including the static model 200 and/or the dynamic model 210, to rank sub-volumes of the reservoir as potential target regions for drilling.

In one implementation, the reasoner 106 includes a fuzzy inference engine that generates a recommendation by reasoning over the underlying reservoir model and evaluating target volumes against a set of one or more rules. The fuzzy inference engine may perform one or more stages of fuzzy inference. The reasoner 106 may generate a set of one or more features computable from the static model 200 and the dynamic model 210. For example, the set of features may include 24 features, such as a distance to aquifer, short term connected oil volume, long term accessible energy, and/or the like. The reasoner 106 utilizes the set of rules relating the values of the set of features to a drilling attractiveness of a node. For example, if energy is high and connected water volume is low and connected oil volume is high and connected oil volume uncertainty is low, then drilling attractiveness is high. Similarly, if short term accessible energy is high and medium term accessible energy is high and long term accessible energy is high, then energy is high. As another example, if distance to aquifer is high then drilling attractiveness is high.

The recommendation generated by the reasoner 106 includes ranked volumes where potential target regions for drillings are ranked in a list. For each of the rankings, the reasoner 106 provides an audit trail detailing, in relative and/or absolute terms, how the ranking was produced. The reasoner 106 further monitors the static modeler 102 and the dynamic modeler 104 for updates, including new inputs and/or changes. If the reasoner 106 detects any updates, the reasoner 106 generates a reranking of the target regions in real time.

Stated differently, in one implementation, the reasoner 106 executes a policy of the set of rules defining desirable and undesirable volume features, and the reasoner 106 combines values for different categories hierarchically to produce an aggregate score for each of the volumes. The ranked volumes includes each of the target regions ranked in a list according to the aggregate scores. As such, the ranked volumes are quantitative ratings, which are output as a user interface that a user may interact with using a user device to inspect the underlying rationale of the rankings to identify target regions for drilling.

Figures 3A, 3B:
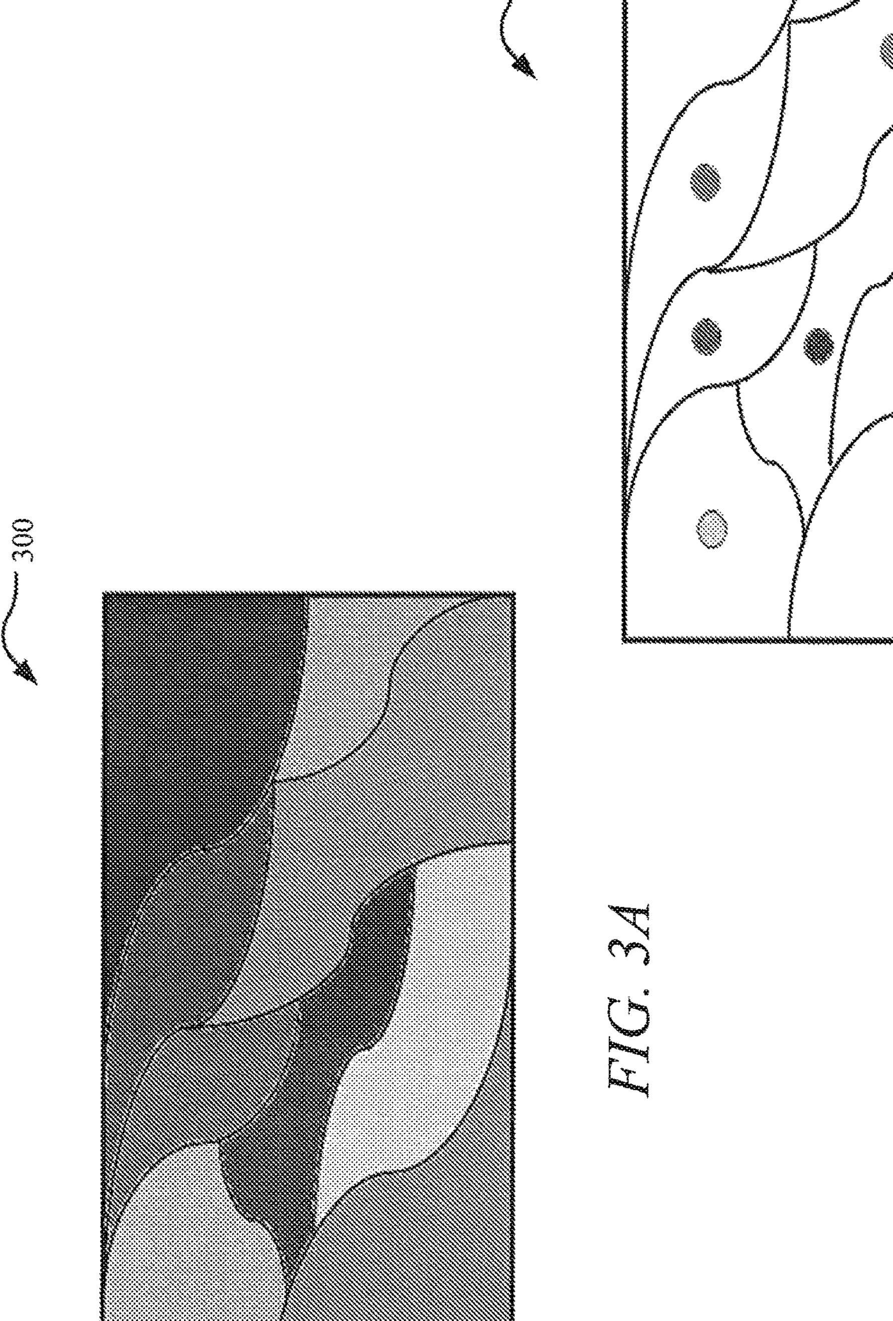
FIG. 3A illustrates a static model of a reservoir having a plurality of clusters.
FIG. 3B shows the static model defined as a reservoir graph.

As can be understood from FIGS. 3A-3B, for each realization, the static modeler 102 generates a static model 300 having a plurality of clusters of rock types, as shown in FIG. 3A. In one implementation, a reservoir graph 302 is defined from the static model 300. More particularly, the reservoir R is defined as graph $G_R$:

$$G_R=(V,E), \text{ where } V=\{v_1,v_2, \ldots ,v_i, \ldots ,v_n\} \text{ and } E=\{ \ldots ,(v_i,v_j), \ldots \}$$

V is thus the set of vertices and E is the set of edges for the graph. The vertex $v_i$ is the centroid of cluster i. For each of the realizations of the static model 300, the reservoir graph 302 may be constructed. In one implementation, the raw static cluster outputs of the static model 300 are further divided in constructing the reservoir graph 302, such that: each cluster has at most one pressure observation point; only one perforation passes through the cluster; and each cluster contains a spatially continuous voxel set only. With respect to the spatially continuous voxel set, a post-processing on the clusters may break discontinuous clusters into continuous blobs. Further, a smoothing algorithm may be applied to dissolve very small clusters in the reservoir graph 302.

Figures 4A, 4B, 4C:
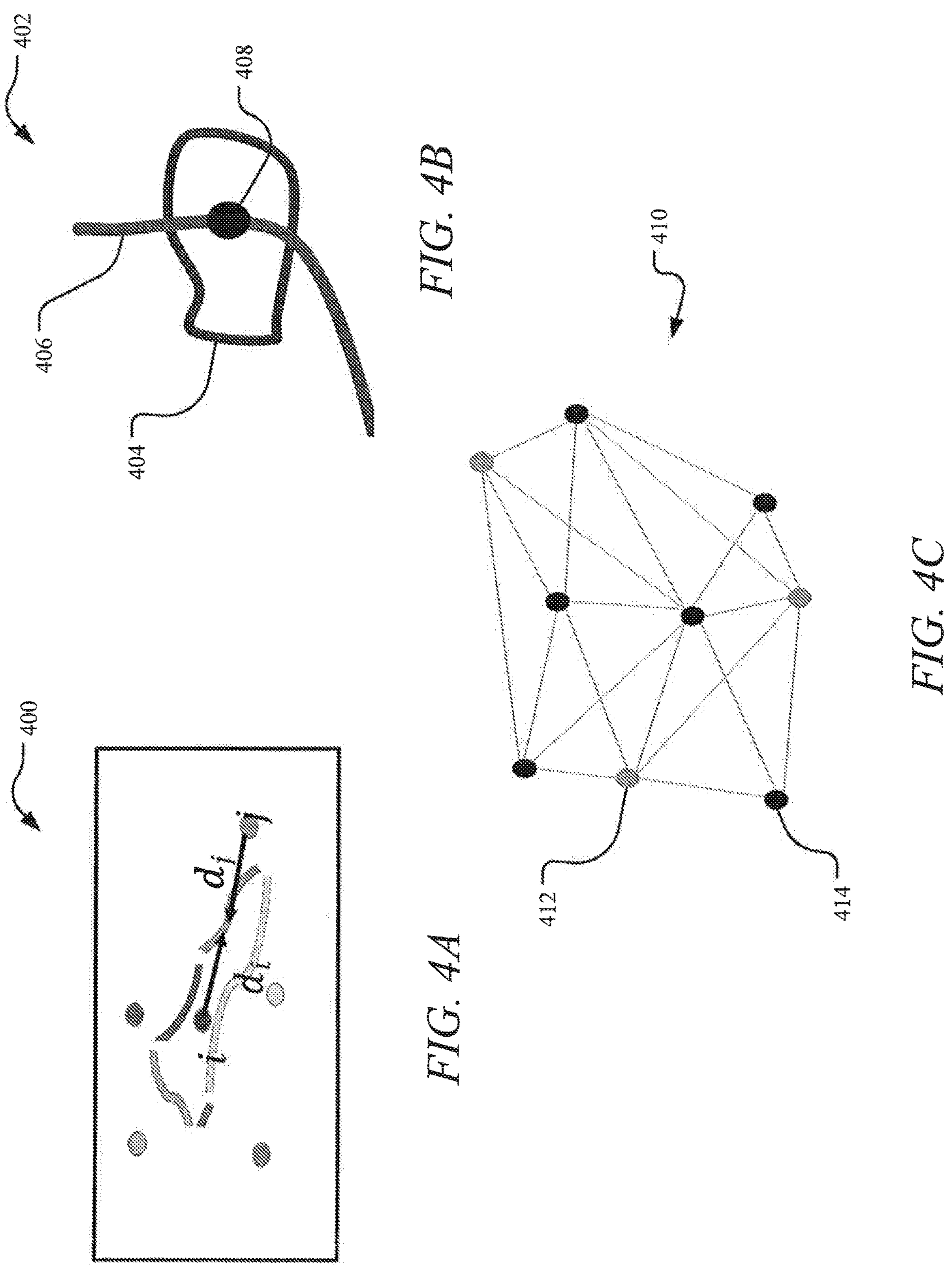
FIG. 4A shows a representation of neighbors of vertex i of the reservoir graph.
FIG. 4B illustrates a representation of an observed pressure assigned to the intersecting cluster.
FIG. 4C depicts a representation of graph connectivity and populated pressure for the reservoir graph.

Turning to FIG. 4A, in one implementation, a vertex i is defined in a neighbor representation 400. The vertex $v_i$ has properties, including, but not limited to, location, porosity, pore volume, permeability, initial oil saturation, passing well name, fault, and/or the like.

The location $(x_i, y_i, z_i)$ is a center of mass for a set of connected voxels in the cluster i. The porosity $\varphi_i$ is an average porosity for voxels in the cluster i, and pore volume is $$PV_{vi}: \sum_{vi}^{N} V_n\varphi_n,$$

where N is a number of voxels in the cluster i and $V_n$ and $\varphi_n$ respectively, are a volume and a porosity of voxel n in the cluster i.

The permeability $K_i$ is an average permeability of the cluster i. In one implementation, since the clusters are defined using permeability values, it is assumed the permeability is continuous in the cluster i. Stated differently, there should be no flow barrier (high permeability contrast) with the cluster itself, and permeability anisotropy is minimal. As such, directional permeability may be disregarded. In another implementation, the clusters are analyzed to ensure there is no flow barrier, however narrow, that can block an entire cross section in a given direction. Heterogeneity in permeability may be tolerated where it is dispersed in the space, and to account for this, directional permeability may be calculated for each of the clusters using a flow simulation or approximation. Similarly, the initial oil saturation $S_{oi}$ is an average initial saturation for voxels in the cluster i. A continuity for the initial oil saturation may be assured similar to the permeability.

In one implementation, the passing well name is the name of the well passing through the cluster i. With respect to fault, if the vertex represents a fault, the value is true. Otherwise, the value is false. In one implementation, if the vertex is a fault, its permeability is zero. In another implementation, if the vertex is a fault, the permeability may be manually or otherwise automatically specified based on the reservoir data 110 and/or the expert data 112. In yet another implementation, the permeability is specified as a learnable parameter.

In one implementation, the vertex i is defined to be a neighbor of vertex j only if their parent clusters have a common surface $S_{ij}$. The area of is denoted as $a_{ij}$ and the center point is $C_{ij}$ with $d_{ij}$ defined as the Euclidean distance from $(x_i, y_i, z_i)$ to $C_{ij}$. For each vertex $v_i$, adjacent vertices, shared area with neighbors, a central point of common surfaces, and other properties using neighbor identification algorithms for edge detection of the reservoir graph 302. The adjacent vertices includes a list of neighbors with vertex i. The shared area with neighbors includes a list of the areas between the vertex i and its neighbors, and the central common point of the common surfaces includes a list of the central point of common surfaces between the vertex i and its neighbors.

Once the edges are detected, a weight is assigned to the edge $(v_i, v_j)$ connecting vertices $v_i$ and $v_j$. In one implementation, the connectivity is defined by applying Darcy's law for a series system:

$$Q = \frac{Ka_{ij}}{\mu}\frac{\Delta P}{(d_i + d_j)} \text{ and } K = \frac{d_i + d_j}{\sum_{n=i,j}\frac{d_n}{K_n}}$$

The effective permeability is therefore:

$$K_{ij} = \frac{K_i K_J}{(K_i d_i + K_j d_j)}$$

and the static connectivity is:

$$CS_{ij} = \frac{a_{ij}K_{ij}}{(d_i + d_j)}$$

The static weight is thus:

$$W_{sij} = \frac{a_{ij}}{\mu_0}\frac{K_i K_j}{(K_i d_i + K_j d_j)}$$

A time of travel is defined as a time it takes for a pressure drop in vertex i to be felt by vertex j. Using radius investigation in the context of a diffusivity equation, the travel distance or time of travel may be defined as:

$$t_{ij} = \frac{d_i^2\varphi\mu C_t}{4K_i} + \frac{d_j^2\varphi\mu C_t}{4K_j}$$

The nodes i, j, thus have static connectivity $D_{ij}$, pressure connectivity $CP_{ij}$, water connectivity $CW_{ij}$, and oil connectivity $CO_{ij}$ defined as follows:

$$D_{ij} = \frac{a_{ij}K_{ij}}{(d_i + d_j)}$$

$$CP_{ij} = \frac{a_{ij}K_{ij}}{\mu(d_i + d_j)}|P_i - P_j|$$

-continued $$CW_{ij} = \frac{a_{ij}K_{w,ij}}{\mu_w(d_i + d_j)}|P_i - P_j|$$

$$CO_{ij} = \frac{a_{ij}K_{o,ij}}{\mu_o(d_i + d_j)}|P_i - P_j|$$

As shown in a representation 402 of FIG. 4B, in one implementation, after clustering the reservoir domain, an observed pressure 408 is assigned to an intersecting cluster 404 for a well 406. As can be understood from a representation 410 of FIG. 4C, connectivity $w_{ij}$ between the cluster i and the cluster j may be used to populate pressure. More particularly, labeled clusters 412 are clusters with a pressure observation, and unlabeled clusters 414 are clusters where pressure will be populated. In one implementation, there may be connectivity values between the labeled clusters 412 and the unlabeled clusters 414 ($Tu_u$) and between the unlabeled clusters 414 and other unlabeled clusters 414 ($T_{ul}$), as can be understood from FIG. 4C. An inversion formula based on graph connectivity therefore provides the pressure for the unlabeled clusters 414:

$$P_{unlabeled} = (i - T_{UU})^{-1} T_{UL} P_{observed}$$

In one implementation, every representation 410 for the graph results in one estimated pressure, with uncertainty represented through uncertainty in the representations 410. As described herein, there are different realizations of the static model 300, thereby resulting in different clusters shown as reservoir graphs 302, which in turn results in different pressures shown in the representations 410.

The nodes with high connectivity are more likely to have similar pressures. Continuity in reservoir fluids allows for propagating pressure from observation points across the 3D network. The areas with no connectivity to the observation points are considered uncertain in pressure values. As such, when a new pressure point becomes available, the new pressure point is propagated across the volume, as it might represent an isolated section of the reservoir. The connectivity in the 3D structure is thus used to propagate pressure observations.

Figures 5A, 5B:
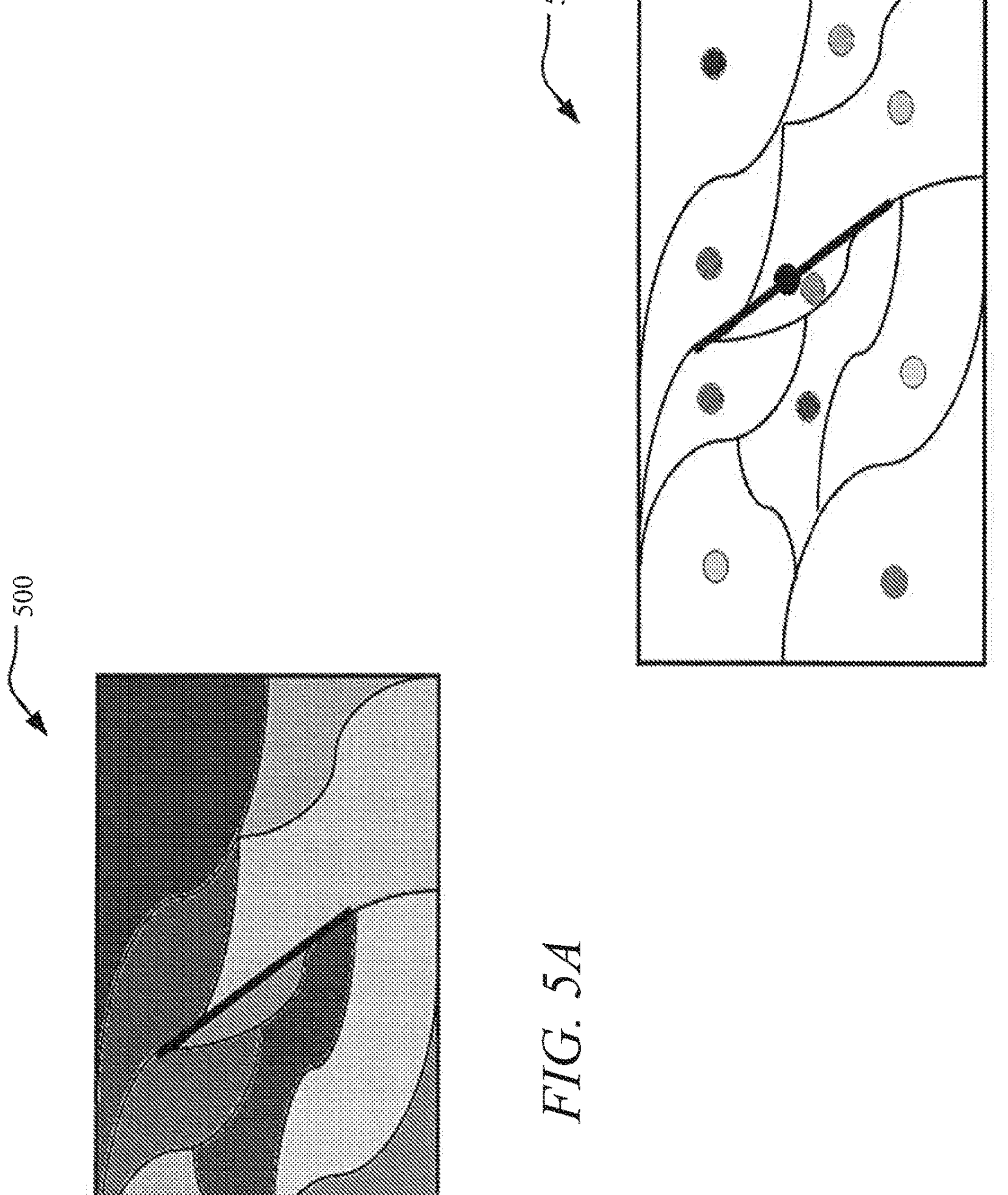
FIG. 5A depicts a fault imposed on the static model.
FIG. 5B illustrates the graph with points of the fault collapsed into a vertex.

Turning to FIG. 5A, an updated model 500 of the rock clusters after the inclusions of a fault is shown. In one implementation, to add a fault to a cluster, a fault plane is imposed on the matrix of clusters, resulting in further division of the clusters. The fault, as shown in updated reservoir graph 502, redefines the boundaries of the system with new nodes. In one implementation, the points of a fault as collapsed into a vertex. The reservoir graph 502 may be automatically updated with new fault planes. The fault planes act as nodes with zero or reduced permeability, and the faults change the permeability across the domain.

The reservoir graphs may have various nodal properties, graph traversal attributes, and/or the like. For example, the nodal properties may include, without limitation, vertex, vertex location, porosity, pre volume, permeability, vertex height, water saturation, static uncertainty, list perforations, fault, fault confidence, shale, aquifer, adjacent vertices, edge weights, time distance, boundary central voxel, shared area neighbors, pressure, and/or the like. The graph traversal attributes may include, without limitation, sorted path index, sorted path time, distance to aquifer, transmissibility, short term connected oil volume, cumulative production of short term interfering wells, short term accessible energy, short term connected water volume, short term connected oil volume uncertainty, medium term connected oil volume, cumulative productions of medium term interfering wells, medium term accessible energy, medium term connected water volume, medium term connected oil volume uncertainty, long term connected oil volume, cumulative production of long term interfering wells, long term accessible energy, long term connected water volume, long term connected oil volume uncertainty, number of nearby faults, average connectivity of nearby faults, average confidence of nearby faults, number of midway faults, average connectivity of midway faults, average confidence of midway faults, number of distant faults, average connectivity of distant faults, average confidence of distant faults, and/or the like. The reasoner 106 may utilize these attributes in generating the ranked volumes.

Figure 6:
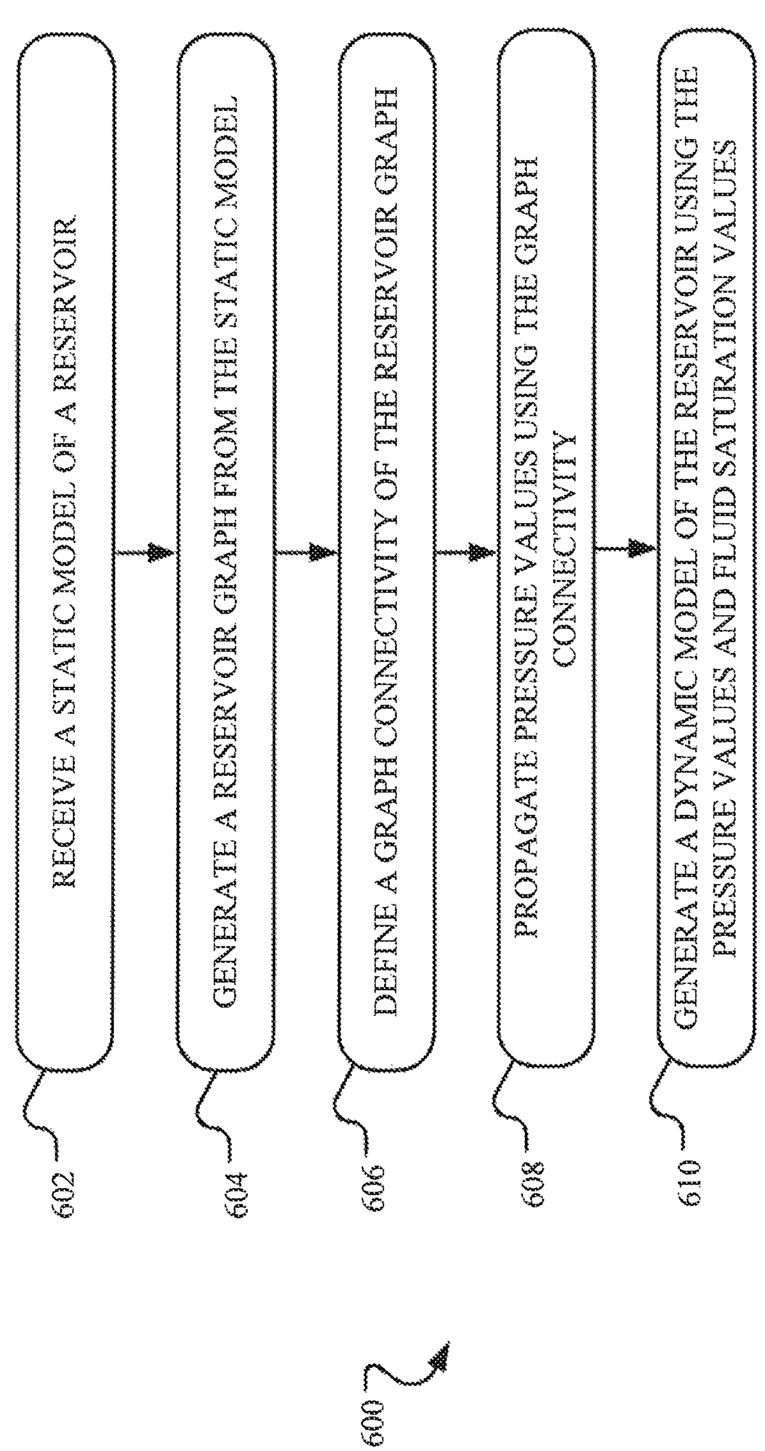
FIG. 6 illustrates example operations for reservoir development.

Referring to FIG. 6, example operations 600 for reservoir development are illustrated. In one implementation, an operation 602 receives a static model of the reservoir. The static model has one or more clusters of rock types. An operation 604 generates a reservoir graph from the static model. The reservoir graph represents each of the one or more clusters as a vertex. An operation 606 defines a graph connectivity of the reservoir graph through a nodal connectivity of neighboring vertices. An operation 608 propagates pressure values across three-dimensional space of the reservoir graph using the connectivity, and an operation 610 generates a dynamic model of the reservoir using the pressure values and fluid saturation values.

Figure 7:
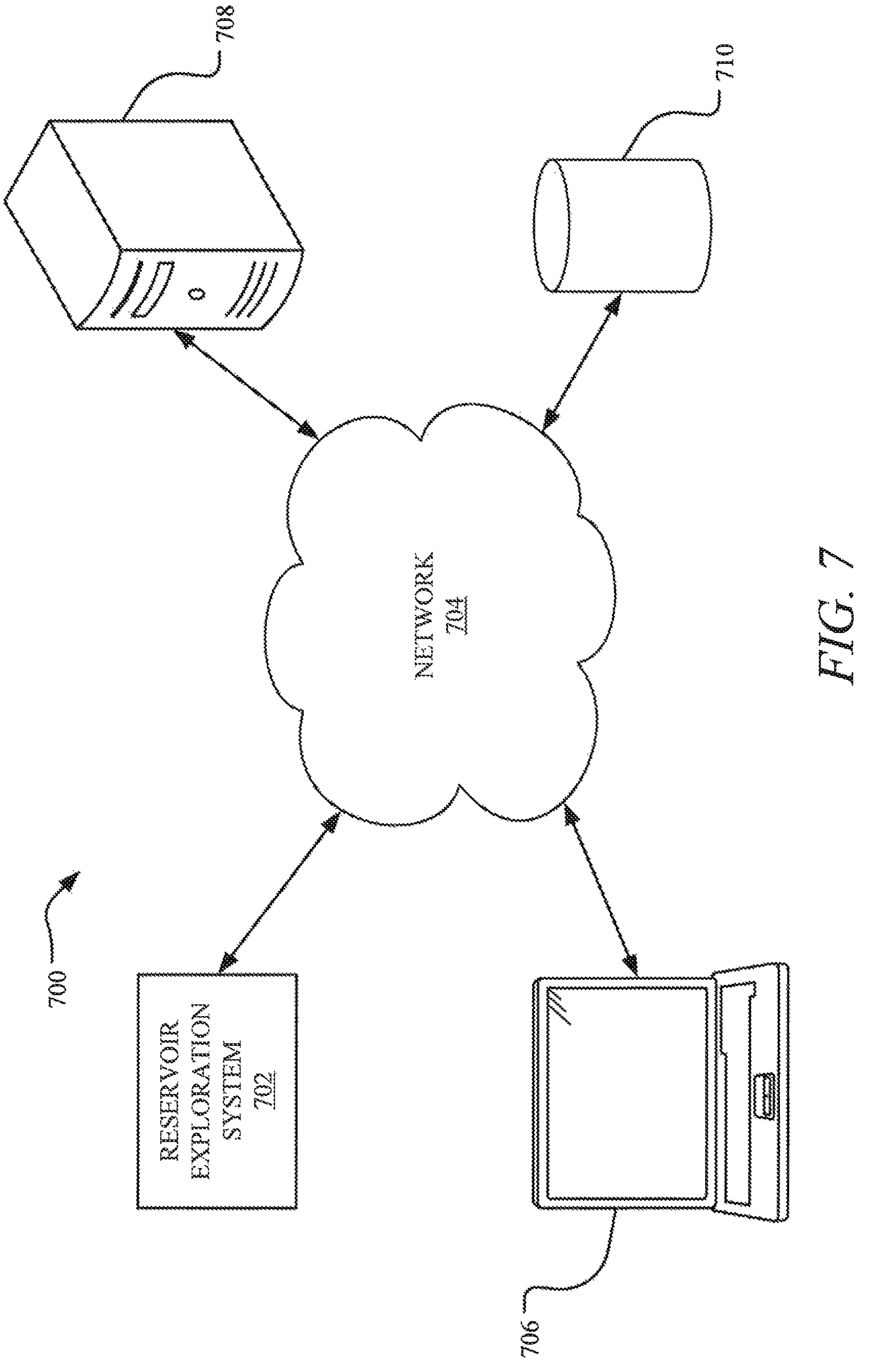
FIG. 7 shows an example network environment that may implement various systems and methods discussed herein.

For a detailed description of an example network environment 700 for reservoir development, reference is made to FIG. 7. In one implementation, a user, such as a member of the interprofessional team, accesses and interacts with a reservoir development system 702 using a user device 706 to access, generate, or otherwise interact with reservoir models, recommendations, underlying data, and/or other information via a network 704. The reservoir development system 702 may incorporate some or all or some of the features of the reservoir development system 100 described herein.

The user device 706 is generally any form of computing device capable of interacting with the network 704, such as a personal computer, terminal, workstation, desktop computer, portable computer, mobile device, smartphone, tablet, multimedia console, etc. The network 704 is used by one or more computing or data storage devices (e.g., one or more databases 710 or other computing units described herein) for implementing the reservoir development system 702 and other services, applications, or modules in the network environment 700. The reservoir data, the expert data, rules, features, reservoir models, recommendations, software, and other information utilized by the reservoir development system 702 may be stored in and accessed from the one or more databases 710.

In one implementation, the network environment 700 includes at least one server 708 hosting a website or an application that the user may visit to access the reservoir development system 702 and/or other network components. The server 708 may be a single server, a plurality of servers with each such server being a physical server or a virtual machine, or a collection of both physical servers and virtual machines. In another implementation, a cloud hosts one or more components of the network environment 700. The user devices 706, the server 708, and other resources connected to the network 704 may access one or more other servers to access to one or more websites, applications, web services interfaces, storage devices, computing devices, or the like that are used for reservoir characterization, exploration, development, and production. The server 708 may also host a search engine that the reservoir development system 702 uses for accessing, searching for, and modifying reservoir models, recommendations, underlying data, and other data, as well as for providing reservoir characterization, exploration, development, and production services, as described herein.

Figure 8:
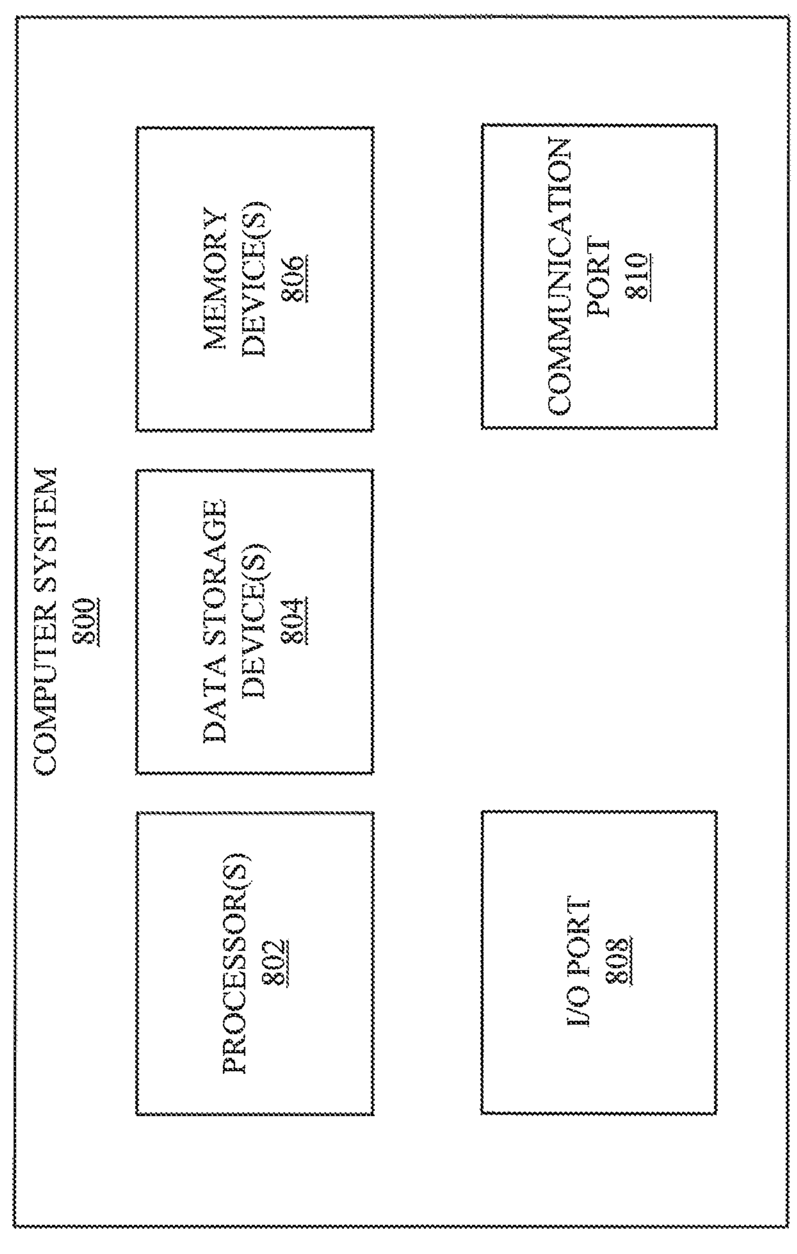
FIG. 8 is an example computing system that may implement various systems and methods discussed herein.

Referring to FIG. 8, a detailed description of an example computing system 800 having one or more computing units that may implement various systems and methods discussed herein is provided. The computing system 800 may be applicable to the reservoir development system 100, the static modeler 102, the dynamic modeler 104, the reasoner 106, the user devices 706, the reservoir development system 702, and other computing or network devices. It will be appreciated that specific implementations of these devices may be of differing possible specific computing architectures not all of which are specifically discussed herein but will be understood by those of ordinary skill in the art.

The computer system 800 may be a computing system is capable of executing a computer program product to execute a computer process. Data and program files may be input to the computer system 800, which reads the files and executes the programs therein. Some of the elements of the computer system 800 are shown in FIG. 8, including one or more hardware processors 802, one or more data storage devices 804, one or more memory devices 808, and/or one or more ports 808-810. Additionally, other elements that will be recognized by those skilled in the art may be included in the computing system 800 but are not explicitly depicted in FIG. 8 or discussed further herein. Various elements of the computer system 800 may communicate with one another by way of one or more communication buses, point-to-point communication paths, or other communication means not explicitly depicted in FIG. 8.

The processor 802 may include, for example, a central processing unit (CPU), a microprocessor, a microcontroller, a digital signal processor (DSP), and/or one or more internal levels of cache. There may be one or more processors 802, such that the processor 802 comprises a single central-processing unit, or a plurality of processing units capable of executing instructions and performing operations in parallel with each other, commonly referred to as a parallel processing environment.

The computer system 800 may be a conventional computer, a distributed computer, or any other type of computer, such as one or more external computers made available via a cloud computing architecture. The presently described technology is optionally implemented in software stored on the data stored device(s) 804, stored on the memory device(s) 806, and/or communicated via one or more of the ports 808-810, thereby transforming the computer system 800 in FIG. 8 to a special purpose machine for implementing the operations described herein. Examples of the computer system 800 include personal computers, terminals, workstations, mobile phones, tablets, laptops, personal computers, multimedia consoles, gaming consoles, set top boxes, and the like.

The one or more data storage devices 804 may include any non-volatile data storage device capable of storing data generated or employed within the computing system 800, such as computer executable instructions for performing a computer process, which may include instructions of both application programs and an operating system (OS) that manages the various components of the computing system 800. The data storage devices 804 may include, without limitation, magnetic disk drives, optical disk drives, solid state drives (SSDs), flash drives, and the like. The data storage devices 804 may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 806 may include volatile memory (e.g., dynamic random access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in the data storage devices 804 and/or the memory devices 806, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In some implementations, the computer system 800 includes one or more ports, such as an input/output (I/O) port 808 and a communication port 810, for communicating with other computing, network, or vehicle devices. It will be appreciated that the ports 808-810 may be combined or separate and that more or fewer ports may be included in the computer system 800.

The I/O port 808 may be connected to an I/O device, or other device, by which information is input to or output from the computing system 800. Such I/O devices may include, without limitation, one or more input devices, output devices, and/or environment transducer devices.

In one implementation, the input devices convert a human-generated signal, such as, human voice, physical movement, physical touch or pressure, and/or the like, into electrical signals as input data into the computing system 800 via the I/O port 808. Similarly, the output devices may convert electrical signals received from computing system 800 via the I/O port 808 into signals that may be sensed as output by a human, such as sound, light, and/or touch. The input device may be an alphanumeric input device, including alphanumeric and other keys for communicating information and/or command selections to the processor 802 via the I/O port 808. The input device may be another type of user input device including, but not limited to: direction and selection control devices, such as a mouse, a trackball, cursor direction keys, a joystick, and/or a wheel; one or more sensors, such as a camera, a microphone, a positional sensor, an orientation sensor, a gravitational sensor, an inertial sensor, and/or an accelerometer; and/or a touch-sensitive display screen ("touchscreen"). The output devices may include, without limitation, a display, a touchscreen, a speaker, a tactile and/or haptic output device, and/or the like. In some implementations, the input device and the output device may be the same device, for example, in the case of a touchscreen.

The environment transducer devices convert one form of energy or signal into another for input into or output from the computing system 800 via the I/O port 808. For example, an electrical signal generated within the computing system 800 may be converted to another type of signal, and/or vice-versa. In one implementation, the environment transducer devices sense characteristics or aspects of an environment local to or remote from the computing device 800, such as, light, sound, temperature, pressure, magnetic field, electric field, chemical properties, physical movement, orientation, acceleration, gravity, and/or the like. Further, the environment transducer devices may generate signals to impose some effect on the environment either local to or remote from the example computing device 800, such as, physical movement of some object (e.g., a mechanical actuator), heating or cooling of a substance, adding a chemical substance, and/or the like.

In one implementation, a communication port 810 is connected to a network by way of which the computer system 800 may receive network data useful in executing the methods and systems set out herein as well as transmitting information and network configuration changes determined thereby. Stated differently, the communication port 810 connects the computer system 800 to one or more communication interface devices configured to transmit and/or receive information between the computing system 800 and other devices by way of one or more wired or wireless communication networks or connections. Examples of such networks or connections include, without limitation, Universal Serial Bus (USB), Ethernet, Wi-Fi, Bluetooth®, Near Field Communication (NFC), Long-Term Evolution (LTE), and so on. One or more such communication interface devices may be utilized via the communication port 810 to communicate one or more other machines, either directly over a point-to-point communication path, over a wide area network (WAN) (e.g., the Internet), over a local area network (LAN), over a cellular (e.g., third generation (3G) or fourth generation (4G)) network, or over another communication means. Further, the communication port 810 may communicate with an antenna or other link for electromagnetic signal transmission and/or reception.

In an example implementation, reservoir data, expert data, rules, features, reservoir models, recommendations, audit trails, software and other modules and services may be embodied by instructions stored on the data storage devices 804 and/or the memory devices 806 and executed by the processor 802.

The system set forth in FIG. 8 is but one possible example of a computer system that may employ or be configured in accordance with aspects of the present disclosure. It will be appreciated that other non-transitory tangible computer-readable storage media storing computer-executable instructions for implementing the presently disclosed technology on a computing system may be utilized.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium, optical storage medium; magneto-optical storage medium, read only memory (ROM); random access memory (RAM); erasable programmable memory (e.g., EPROM and EEPROM); flash memory; or other types of medium suitable for storing electronic instructions.

While the present disclosure has been described with reference to various implementations, it will be understood that these implementations are illustrative and that the scope of the present disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A method for developing reservoir models, the method comprising:

generating a static model based static data regarding a reservoir, the static data identifying one or more clusters of rock types and one or more faults in the clusters;

generating a reservoir graph from a static model using a neural network, the reservoir graph representing each cluster of the one or more clusters as a vertex, wherein each cluster has at least one of one pressure observation point, one perforation pass through, and a spatially continuous voxel set;

propagating pressure values across a three-dimensional space of the reservoir based on nodal connectivity of neighboring clusters in accordance with the faults indicated by the static data;

transforming the static data into one or more dynamic models of the reservoir based on the static model and the pressure values;

evaluating target regions of the reservoir that correspond to volumes of the dynamic models, wherein evaluating each of the target regions includes using a set of one or more rules and fuzzy inference on values of a set of features of a corresponding volume;

generating a ranked list of the target regions with information of where to drill based on the evaluation, each of the target regions ranked in accordance with an aggregated score assigned to the set of features of the corresponding volume;

automatically updating the reservoir graph based on nodal connectivity of the inferred values of the corresponding volume of target regions; and outputting on a user interface the ranked list of the target regions identifying where to drill.

2. The method of claim 1, further comprising:

defining a graph connectivity of the reservoir graph through a nodal connectivity of neighboring vertices, wherein propagating the pressure values is based on the defined graph connectivity.

3. The method of claim 2, further comprising post-processing on the one or more clusters to break discontinuous clusters into continuous blob, wherein defining the graph connectivity is based on the post-processed of the one or more clusters.

4. The method of claim 1, wherein the set of features includes one or more of distance to aquifer, short term connect oil volume, and long term accessible energy, well log data, and well trajectory data, location, porosity, permeability, initial saturation, modal properties, and graph traversal attributes.

5. The method of claim 1, further comprising augmenting the dynamic models with additional data or modular properties over time, wherein subsequent evaluations of the target regions are based on the augmented dynamic models.

6. The method of claim 5, wherein the additional data corresponds to an added fault, wherein integrating the additional data into the dynamic models includes redefining boundaries of the reservoir to include one or more new nodes.

7. The method of claim 1, wherein the static data includes four-dimensional seismic data corresponding to time-lapsed three-dimensional subsurface images, and further comprising determining fluid saturation values based on the four-dimensional seismic data, wherein propagating the pressure values is based on the determined fluid saturation values.

8. One or more non-transitory tangible computer-readable storage media storing computer-executable instructions executed by a processor to perform a method for developing reservoir models, the method comprising:

generating a static model based on static data regarding a reservoir, the static data identifying one or more clusters of rock types and one or more faults in the clusters;

generating a reservoir graph from the static model using a neural network, the reservoir graph representing each of the one or more clusters as a vertex, wherein each cluster has at least one of one pressure observation point, one perforation pass through, and a spatially continuous voxel set;

propagating pressure values across a three-dimensional space of the reservoir based on nodal connectivity of neighboring clusters in accordance with the faults indicated by the static data;

transforming the static data into one or more dynamic models of the reservoir based on the static model and the pressure values;

evaluating target regions of the reservoir that correspond to volumes of the dynamic models, wherein evaluating each of the target regions includes using a set of one or more rules and fuzzy inference on values of a set of features of a corresponding volume;

generating a ranked list of the target regions with information of where to drill based on the evaluation, each of the target regions ranked in accordance with an aggregated score assigned to the set of features of the corresponding volume;

automatically updating the reservoir graph based on nodal connectivity of the inferred values of the corresponding volume of target regions; and outputting on a user interface the ranked list of the target regions identifying where to drill.

9. The non-transitory tangible computer-readable storage media of claim 8, further comprising instructions executable to:

define a graph connectivity of the reservoir graph through a nodal connectivity of neighboring vertices, wherein propagating the pressure values is based on the defined graph connectivity.

10. The non-transitory tangible computer-readable storage media of claim 9, further comprising instructions executable to post-process the one or more clusters to break discontinuous clusters into continuous blob, wherein defining the graph connectivity is based on the post-processed of the one or more clusters.

11. The non-transitory tangible computer-readable storage media of claim 8, wherein the set of features includes one or more of distance to aquifer, short term connect oil volume, and long term accessible energy, well log data, and well trajectory data, location, porosity, permeability, initial saturation, modal properties, and graph traversal attributes.

12. The non-transitory tangible computer-readable storage media of claim 8, further comprising instructions executable to augment the dynamic models with additional data or modular properties over time, wherein subsequent evaluations of the target regions are based on the augmented dynamic models.

13. The non-transitory tangible computer-readable storage media of claim 12, wherein the additional data corresponds to an added fault, and further comprising instructions executable to integrate the additional data into the dynamic models by redefining boundaries of the reservoir to include one or more new nodes.

14. The non-transitory tangible computer-readable storage media of claim 8, wherein the static data includes four-dimensional seismic data corresponding to time-lapsed three-dimensional subsurface images, and further comprising instructions executable to determine fluid saturation values based on the four-dimensional seismic data, wherein propagating the pressure values is based on the determined fluid saturation values.

15. A system for developing reservoir models, the system comprising:

one or more processors that execute:

a static modeler comprising one or more neural networks configured to generate a static model of a reservoir based on received static data regarding a reservoir, the static data identifying one or more clusters of rock types and one or more faults in the clusters, a dynamic modeler in communication with the static modeler, the dynamic modeler using artificial intelligence to:

generate a reservoir graph from the static model, the reservoir graph representing each cluster of the one or more clusters as a vertex, wherein each neighboring cluster has at least one of one pressure observation point, one perforation pass through, and a spatially continuous voxel set;

propagate pressure values across a three-dimensional space of the reservoir based on nodal connectivity of neighboring clusters in accordance with the faults indicated by the static data, and transform the static model into one or more dynamic models of the reservoir based on the static model and the pressure values; and a reasoner that includes a fuzzy inference engine, wherein the reasoner using the fuzzy inference engine to:

evaluate target regions of the reservoir that correspond to volumes of the dynamic models, wherein evaluating each of the target regions includes using a set of one or more rules and fuzzy inference on values of a set of features of a corresponding volume;

generate a ranked list of the target regions with information of where to drill based on the evaluation, each of the target regions ranked in accordance with an aggregated score assigned to the set of features of the corresponding volume;

automatically update the reservoir graph based on nodal connectivity of the inferred values of the corresponding volume of target regions; and outputting on a user interface the ranked list of the target regions identifying where to drill.

16. The system of claim 15, wherein the one or more processors further execute the dynamic modeler to:

define a graph connectivity of the reservoir graph through a nodal connectivity of neighboring vertices, wherein propagating the pressure values is based on the defined graph connectivity.

17. The system of claim 16, wherein the one or more processors further execute the dynamic modeler to post-process the one or more clusters to break discontinuous clusters into continuous blob, wherein defining the graph connectivity is based on the post-processed of the one or more clusters.

18. The system of claim 15, wherein the set of features includes one or more of distance to aquifer, short term connect oil volume, and long term accessible energy, well log data, and well trajectory data, location, porosity, permeability, initial saturation, modal properties, and graph traversal attributes.

19. The system of claim 15, wherein the one or more processors further execute the dynamic modeler to augment the dynamic models with additional data or modular properties over time, wherein subsequent evaluations of the target regions by the reasoner are based on the augmented dynamic models.

20. The system of claim 19, wherein the additional data corresponds to an added fault, wherein integrating the additional data into the dynamic models includes redefining boundaries of the reservoir to include one or more new nodes.

21. The system of claim 15, wherein the static data includes four-dimensional seismic data corresponding to time-lapsed three-dimensional subsurface images, and wherein the one or more processors further execute the dynamic modeler to determine fluid saturation values based on the four-dimensional seismic data, wherein propagating the pressure values is based on the determined fluid saturation values.

* * * * *